Figure 1:
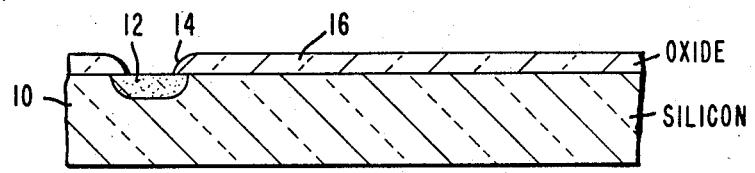

United States Patent [19]

Lee et al.

[11] Patent Number: 4,592,132
[45] Date of Patent: Jun. 3, 1986

[54] PROCESS FOR FABRICATING MULTI-LEVEL-METAL INTEGRATED CIRCUITS AT HIGH YIELDS

[75] Inventors: William W. Y. Lee; Gareth L. Shaw, both of Fountain Valley; James W. Clayton, deceased, late of Santa Ana; Denise Bachino, administrator, Santa Maria, all of Calif.

[73] Assignee: Hughes Aircraft Company, Los Angeles, Calif.

[21] Appl. No.: 679,506

[22] Filed: Dec. 7, 1984

[51] Int. Cl.[4] ............................................. H01L 21/47
[52] U.S. Cl. ........................................ 29/590; 29/589; 29/591; 29/578; 156/661.1; 357/71
[58] Field of Search ................. 29/589, 590, 591, 578; 156/661.1; 357/71

[56] References Cited

U.S. PATENT DOCUMENTS

| 4,398,964 | 8/1983 | Malwah | 156/661.1 |
| 4,409,319 | 10/1983 | Colacino et al. | 156/661.1 |
| 4,415,606 | 11/1983 | Cynkar et al. | 156/651 |
| 4,517,731 | 5/1985 | Khan et al. | 29/578 |
| 4,523,975 | 6/1985 | Groves et al. | 156/661.1 |

Primary Examiner—Brian E. Hearn
Assistant Examiner—Hunter L. Auyang
Attorney, Agent, or Firm—A. W. Karambelas; Kenneth W. Float

[57] ABSTRACT

Inter-layer electrical shorting between layers of conductors of an integrated circuit caused by "hillocks" in the bottom layer is prevented by the use of a double layer photoresist coatings atop the insulating layer that separates the metal layers. The double layer photoresist insures that irregularities in the dielectric layer caused by hillocks in the underlying insulating layer do not cause a break in the photoresist and a subsequent undesired etching of a spurious "via" through the dielectric layer.

4 Claims, 8 Drawing Figures

PROCESS FOR FABRICATING MULTI-LEVEL-METAL INTEGRATED CIRCUITS AT HIGH YIELDS

FIELD OF THE INVENTION

This invention relates generally to multi-level-metal integrated circuits (ICs) and, more particularly, to a process for improving yields in the fabrication of such circuits.

BACKGROUND

In the fabrication of multi-level-metal integrated circuits, it is known to provide a first level of metalization which makes direct ohmic contact with a chosen area of a semiconductor substrate, such as silicon, and thereafter deposit a second level of metalization above and physically separated from the first layer of metalization. The second level of metalization will normally be insulated from the first level of metalization by a chosen dielectric material, such as silicon dioxide, which is referred to in the art as the "inter-layer dielectric." In structures where only two levels of metalization are used, the acronym "DLM" has been used to refer to "double-level-metal" structures and integrated circuits.

In order to make desired vertical electrical interconnections between the first and second levels of metalization, one practice has been to use conventional ultraviolet (UV) photolithographic masking and etching techniques to provide a protective photoresist coating of a desired geometry on top of the inter-layer dielectric and then etch openings or vias through this dielectric layer in areas exposed by openings in the photoresist coating. After this etching step was completed, the deposition of the second layer of metalization was made on the inter-layer dielectric and through these openings or vias to make vertical contact to the first layer of metalization.

While the above process has been satisfactory for processing smooth uniform layers of metalization, it has not been entirely satisfactory in maintaining acceptable yields where the layers of metalization had hillocks or spikes thereon. These hillocks or spikes are in the form of sharp up-standing imperfections in the metalization which may sometime extend one to two micrometers above the horizontal surface of the metalization. These spikes are produced by uneven nucleation in the metal which takes place in the metal deposition and cooling process.

The reason for the unacceptable yields was a failure of the above photoresist coating to conform with and vertically replicate the geometry of these hillocks or spikes. Thus, the photoresist coating did not adequately conform to and cover the inter-layer dielectic in areas where this dielectric layer was vertically "pushed up" by the underlying hillocks or spikes on the first layer of metalization. As a general rule, the inter-layer dielectric conforms quite satisfactorily to the geometry of the underlying metal hillocks or spikes, but this is not the case with the photoresist coating which is deposited over the subsequently formed protrusions in the inter-layer dielectric replicating the hillocks or spikes in the metal. This non-conformity, in turn, caused these protrusions in the inter-layer dielectric to extend in some areas completely through the overlying photoresist coating and thereby subsequently produce undesirable electrical shorts between the first and second levels of metalization. This problem of electrical shorting will become more readily apparent in the following description of the present invention.

In order to solve the above problem, it has been proposed to merely increase the thickness of the photoresist coating in an attempt to fully cover protrusions in the inter-layer dielectric at all times. However, this approach has also proven unsatisfactory since the solvent in the added photoresist tends to dissolve the earlier deposited photoresist material, with the end result being unacceptable conformity of the thicker photoresist layer and unacceptable electrical shorts still being produced between the first and second levels of metalization.

THE INVENTION

In accordance with the present invention, it has been discovered that this problem of electrical shorting between the first and second levels of metalization can be substantially eliminated and that device fabrication yields can be substantially increased by providing separate first and second layers of photoresist for coating the inter-layer dielectric. The first layer of photoresist is treated so as to make it impervious to the solvent in the second layer of photoresist. In this manner, it is possible to attain an overall photoresist thickness sufficient to completely cover hillocks or spikes replicated in the underlying inter-layer dielectric and thereby prevent undesirable electrical shorts in the integrated circuit being fabricated.

In a preferred embodiment of the invention, we utilize a combination of negative photoresist and positive photoresist materials in the process of defining vias in the inter-layer dielectric. This coating step is made in preparation for the deposition of the second level of metalization atop the inter-layer dielectric and through the vias etched therein to make electrical contact with the first layer of metalization. By utilizing a combination of negative and positive photoresist polymers to build up the photoresist to a desired thickness, the solvents in these respective photoresist materials do not adversely interact with each other and do not tend to dissolve the adjacent negative or positive photoresist material. In this manner, the photoresist coating can be built up to a desired thickness without difficulty and completely cover the inter-layer dielectric and thereby substantially increase the yield of the fabrication process.

The above advantages and other objects and features of this invention will become more readily apparent in the following description of the accompanying drawings.

DRAWINGS

FIGS. 1-8 illustrate schematically a process sequence according to the present invention wherein first and second levels of metalization are formed in a double level metal (DLM) integrated circuit structure and then an interconnection is made between these first and second levels of metal.

GENERAL DESCRIPTION

Referring now to FIG. 1, there is shown a silicon substrate 10 which is typically 20 mils in thickness and of approximately 1 ohm-centimeter resistivity. The substrate 10 will, for example, have an active region 12 therein to which electrical contact is necessary and which may have been formed using conventional diffusion or ion implantation doping techniques. For example, an impurity diffusion may have been previously carried out through an opening 14 previously formed in a surface silicon dioxide passivation layer 16. The SiO₂ layer 16 may, for example, be thermally grown to a thickness of approximately 700 angstroms for a gate oxide application or grown thicker to approximately 1 micrometer if it is to serve as a "field oxide", as is well known in the art.

Figure 2:
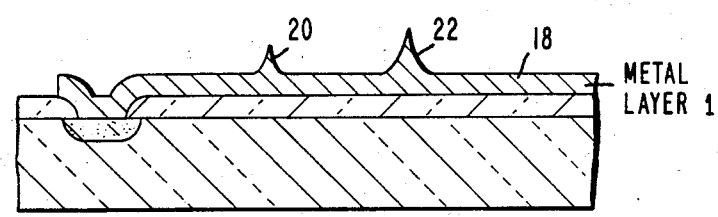

Referring now to FIG. 2, using conventional metal evaporation techniques a first layer of metalization 18 is deposited as shown over the upper surface portions of the surface oxide 16 and into ohmic contact with the active device region 12. The first layer of metalization 18 may, for example, be sputtered using known aluminum sputtering techniques to a thickness of a approximately 6,000 angstroms, and the aluminum layer 18 may include spikes or hillocks 20 and 22 which sometimes protrude vertically as much as 1–2 micrometers above the upper horizontal surface of the first layer of metalization 18. As mentioned, these spikes or hillocks 20 and 22 are localized growths which are thought to be produced by the migration of aluminum atoms during the cooling of the metal layer 18.

Figure 3:
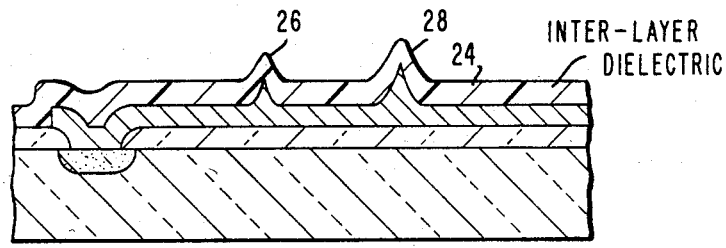

Referring now to FIG. 3, a second insulating layer 24, such as silicon dioxide and referred to as the "inter-layer dielectric" is deposited as shown atop the first level metal layer 18. The hillocks 20 and 22 in the first level of metal 18 will normally be covered quite uniformly at the protruded oxide regions 26 and 28, respectively, in SiO₂ layer 24. This inter-layer dielectric 24 may be deposited on the metal layer 18 using known chemical vapor deposition (CVD) techniques and at relatively low temperatures on the order of 450° C. One process which may be used to form the dielectric SiO₂ layer 24 is known in the art as the SILOX process and combines silane, SiH₄, with oxygen at approximately 450° C. to yield silicon dioxide and water vapors. The dielectric layer 24 will typically be about 1 micrometer in thickness for many types of metal-oxide-silicon (MOS) integrated circuits.

Figure 4:
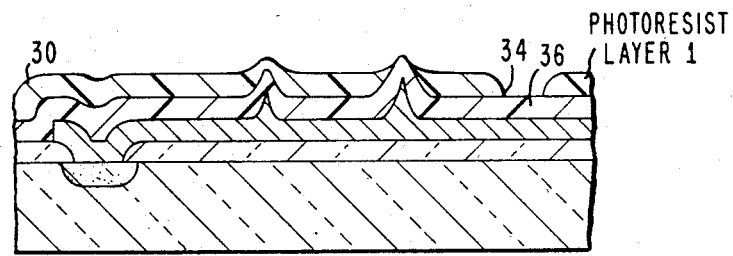

After the latter step is completed, the structure of FIG. 3 is transferred to a photoresist deposition station wherein a first layer 30 of negative photoresist is deposited as shown in FIG. 4. The photoresist layer 30 is then processed using conventional photolithographic coating and etching techniques to define a first, coarse or low tolerance opening 34 which is typically about 10 micrometers across. As shown in FIG. 4, the first, negative photoresist layer 30 conforms somewhat to the underlying silicon dioxide layer 24 and may even completely cover less severe or sharp protrusions, e.g., 26, which are pushed upwardly by the metal hillock 20. However, sharper protrusions 28 in the inter-layer dielectric 24 and produced by the sharper underlying metal spikes or hillocks 22 are often not completely covered by the photoresist layer 30, as also shown in FIG. 4. It is these sharper protrusions 28 which cause electrical shorts now alleviated by the present invention. That is, if one were to use only a single layer of photoresist as indicated in FIG. 4 and proceed to etch away the region 36 of SiO₂ layer 24 in preparation for a double-level-metal interconnect step, one would also etch away the inter-layer dielectric at its exposed protrusion 28. This step will undesirably expose the underlying metal hillock 22 which, in turn, will subsequently form an undesirable vertical short between the first and second levels of metalization.

Figure 5:
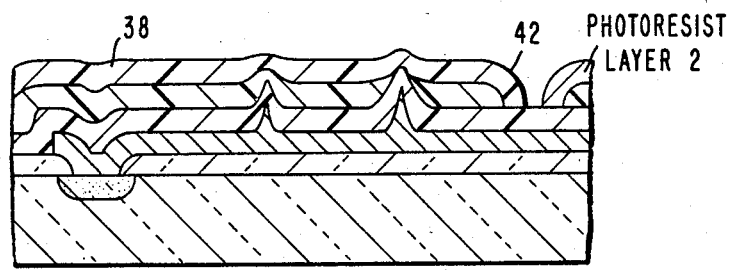

However, in accordance with the present invention, a second, positive photoresist layer 38 is deposited as shown in FIG. 5 so as to completely cover the protrusion 28 in the underlying dielectric inter level oxide 24. After the second photoresist layer 38 has been deposited, then conventional photoresist processing (baking) and photolithographic coating and etching techniques are utilized to form a fine or high tolerance opening 42 within the previously formed coarse opening 34 in the first photoresist layer 30. Typically, the coarse opening or line width 34 will be about 10 micrometers across, whereas the fine opening or line width 42 will be about 3 micrometers across and precisely centered in the area where the first layer of metalization is to be vertically interconnected with the second layer of metalization.

In forming the expanded or coarse opening 34, a layer 30 of Hunt HNR-120 negative photoresist was used and was obtained from the Hunt Chemical Company of Palisades Park, N.J. 07650. The fine opening 42 was formed in a layer 38 of positive photoresist known as Shipley AZ 1470 and obtained from the Shipley Corporation of Newton, Mass. 02162. Other parameters which were used in forming these two photoresist layers 30 and 38 are given in the Table below.

|  | FIRST LAYER (COARSE OPENING) | SECOND LAYER (FINE OPENING) |
| --- | --- | --- |
| PHOTORESIST TYPE | HUNT HNR-120 NEGATIVE | SHIPLEY AZ 1470 POSITIVE |
| VISCOSITY (25° C.) | 26–32 CENTIPOISE | 13–18 CENTIPOISE |
| SPIN SPEED | 5000 RPM | 5000 RPM |
| THICKNESS | 1.1 MICROMETERS | 1.1 MICROMETERS |
| EXPOSURE TIME | LIGHT FIELD 2.5 SECONDS | DARK FIELD 4.5 SECONDS |
| BAKE TIME/TEMP | 20 MIN. @ 75 ± 2° C. | 30 MIN. @ 90 ± 2° C. |

For a further discussion of photoresist processing, reference may be made to William S. DeForest: *Photoresist Materials and Process*, McGraw-Hill, 1975, which is incorporated herein by reference.

It should be understood that the present invention is not limited to the utilization of only negative and positive layers of photoresist to form the composite photoresist coating, but rather is intended to include any multilayer photoresist build up process wherein the individual layers are impervious to attack from the solvent in an adjacent layer. Thus, the first and second layers 30 and 38 of photoresist may both be negative or both be positive provided that they are treated so as to be impervious to the solvents utilized in the formation of the preceeding or subsequent photoresist layer. This may be accomplished, for example, by exposing the first layer 30 to a plasma of Freon[14] gas at a pressure of 1 Torr and an RF power of 100 watts and heating the layer for approximately 5 minutes. Advantageously, this plasma treatment may be carried out using a barrel etch machine of the type made available by the Tegal Corporation of Novato, Calif. 94947.

Alternatively, the first layer 30 of photoresist may be treated by exposing it to deep ultraviolet radiation followed by a 200° C. bake for 30 minutes. The radiation hardens the photoresist surface and prevents any distortion of features by the high temperature bake. This combined radiation and heat treatment process will render it impervious to attack by solvents in the second layer 38.

Additionally, the second layer 38 may be treated so as to prevent solvents contained therein from reacting with first layer, or, alternatively or additionally, the second layer 38 may be treated so as to render it harmless to reaction with any solvents remaining from the formation of the first layer.

Figure 6:
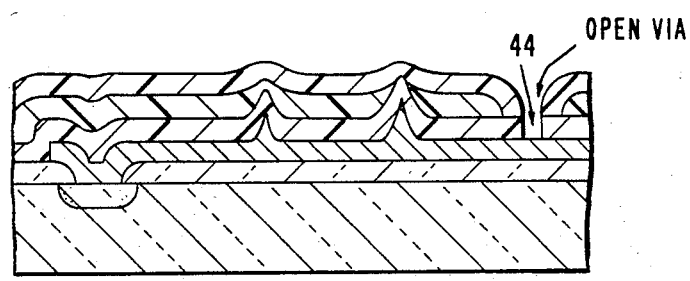
Figure 7:
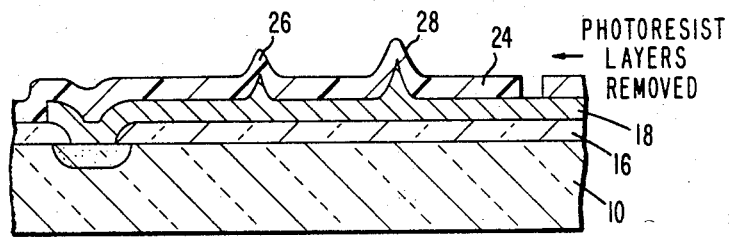
Figure 8:
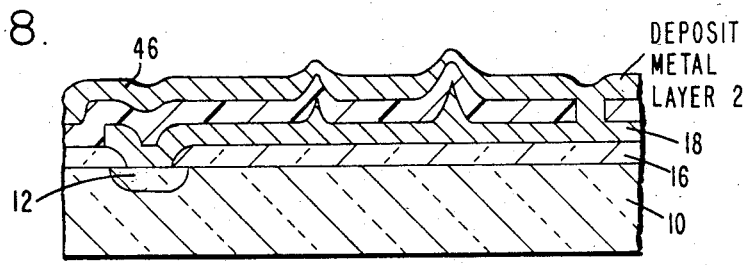

Once the via 44 has been etched in the inter-layer dielectric 24 to expose a selected area of the first level of metal as shown in FIG. 6, the two photoresist layers 30 and 38 are removed as shown in FIG. 7 using standard photoresist processing techniques. Then the structure of FIG. 7 is transferred to an aluminum metal evaporation station wherein a second level 46 of metalization is deposited as shown in FIG. 8 on the upper surface of the inter-layer dielectric 24 and down into contact with the first level 18 of metalization at the via opening 44. The second level of metalization 46 may then be patterned in any desired geometry using conventional photoresist coating and metal etching techniques which are well known in the art.

What is claimed is:

1. In a process for fabricating multi-level metal integrated circuits wherein at least first and second layers of metal are deposited above a semiconductor substrate and are separated there by an inter-layer dielectric material, the improvement comprising: forming a relatively thick photoresist coating atop said inter-layer dielectric by initially forming a first layer of photoresist on the surface of said inter-layer dielectric, then treating said first layer in a manner that makes it substantially impervious to photoresist solvents, and then forming a second layer of photoresist atop said first layer of photoresist to a thickness sufficient to cover vertical protrusions in said inter-layer dielectric resulting from hillocks or spikes in said first layer of metal, whereby the multilayer photoresist coating maintains its thickness and conformity with said inter-layer dielectric, thereby preventing electrical shorts between said first and second metal layers and enhancing process fabrication yields.

2. The process defined in claim 1 wherein said first layer of photoresist substantially is exposed to a gas plasma at a predetermined pressure and predetermined elevated temperature for a time sufficient to render said first layer of photoresist impervious to solvents in a subsequently applied second layer of photoresist.

3. In a process for fabricating multi-level metal integrated circuits wherein at least first and second layers of metal are deposited above a semiconductor substrate and are separated there by an inter-layer dielectric, the improvement comprising: forming a complete photoresist coating by forming both negative and positive layers of photoresist atop said inter-layer dielectric to a thickness sufficient to cover any vertical protrusions in said inter-layer dielectric produced by hillocks or spikes in said first metal layer, said negative and positive photoresist layers including different solvents that do not significantly interact with or harm the respective negative or positive photoresist layers, thereby enabling said composite photoresist coating to maintain its thickness and conformity with said inter-layer dielectric and prevent electrical shorts between said first and second metal layers, whereby fabrication yields of said process are enhanced.

4. The process defined in claim 3 wherein said negative photoresist layer is a negative resist polymer and said positive photoresist layer is a positive resist polymer, and said polymers are deposited and baked-on sequentially for predetermined baking times and temperatures sufficient to render them impervious to attack by certain photoresist solvents.

* * * * *